(12) United States Patent
Archambeault

(10) Patent No.: US 6,418,031 B1
(45) Date of Patent: Jul. 9, 2002

(54) METHOD AND MEANS FOR DECOUPLING A PRINTED CIRCUIT BOARD

(75) Inventor: Bruce Roy Archambeault, Durham, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/564,394

(22) Filed: May 1, 2000

(51) Int. Cl.[7] ................................................ H05K 1/18
(52) U.S. Cl. ..................... 361/762; 361/794; 361/782; 361/793; 361/792; 361/780; 174/255; 333/246; 333/247; 333/219
(58) Field of Search ........................... 361/762, 719, 361/734, 735, 738, 748, 763, 780, 794, 753, 736, 808, 795, 792, 793, 782; 174/255; 333/12, 246, 247, 204, 238, 236, 219, 219.1, 212, 24 C

(56) References Cited

U.S. PATENT DOCUMENTS

| | | |
|---|---|---|
| 4,916,576 A | 4/1990 | Herbert et al. |
| 5,089,878 A | 2/1992 | Lee |
| 5,479,138 A * | 12/1995 | Kuroda et al. .................. 333/1 |
| 5,556,811 A | 9/1996 | Agatstein et al. |
| 5,825,628 A | 10/1998 | Garbelli et al. |
| 5,898,576 A | 4/1999 | Lockwood et al. |
| 6,166,457 A * | 12/2000 | Iguchi et al. .................. 307/91 |
| 6,198,362 B1 * | 3/2001 | Harada et al. ................ 333/12 |
| 6,211,576 B1 * | 4/2001 | Shimizu et al. ............. 257/786 |

* cited by examiner

*Primary Examiner*—Jeffrey Gaffin
*Assistant Examiner*—Hung Bui

(57) ABSTRACT

An improved method and means for decoupling a printed circuit board are disclosed. A power plane is included having a peripheral edge. The power plane includes a first region and a second region which is separate from and contiguous to the first region. The first region is located from the peripheral edge to a middle portion of the power plane. The first region includes a peripheral portion of the power plane. The second region includes only the middle portion of the power plane. A ground plane is coupled in parallel to the power plane. The ground plane has a peripheral edge. The ground plane includes a first region, and a second region which is separate from and contiguous to the first region. The first region includes the peripheral edge and includes a peripheral portion of the ground plane. The second region includes a middle portion of the ground plane. A first plurality of decoupling elements are connected to the first region of the power plane and to the first region of the ground plane. A second plurality of decoupling elements are connected to the second region of the power plane and to the second region of the ground plane. The first and second plurality of decoupling elements are utilized to decouple the power plane and ground plane pair.

42 Claims, 4 Drawing Sheets

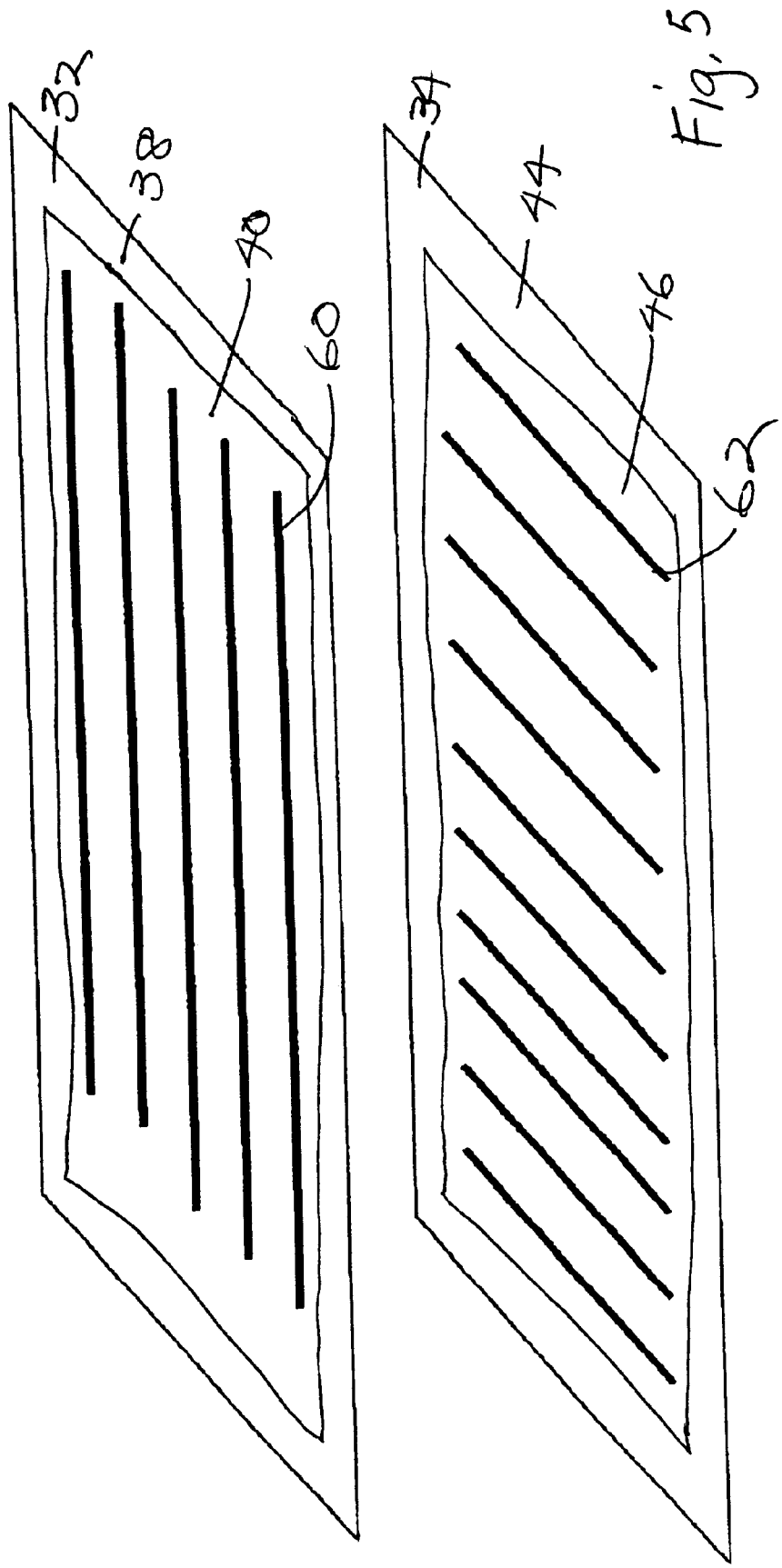

METHOD AND MEANS FOR DECOUPLING A PRINTED CIRCUIT BOARD

BACKGROUND OF THE INVENTION

1. Field of the Invention

The present invention relates in general to printed circuit boards and, in particular, to an improved method and means for decoupling parallel planes included within a printed circuit board. Still more particularly, the present invention relates to a method and means for decoupling parallel planes included within a printed circuit board utilizing a first plurality of decoupling elements in a first region of the planes and a second plurality of decoupling elements in a second region of the planes.

2. Description of the Related Art

The inclusion of a capacitive decoupling network between the power and ground planes of a printed circuit board (PCB) is well known and desirable for a number of reasons. Specifically, decoupling capacitors may be provided in the form of discrete decoupling capacitors connected between the power and ground planes of the PCB, the discrete decoupling capacitors being located adjacent to loads, which typically comprise integrated circuits (ICs) mounted on the PCB. Decoupling capacitance is also provided in the form of intrinsic capacitance by the parallel location of the power and ground planes with a PCB. This decoupling capacitance serves to provide fast rise time current to the integrated circuit (IC) loads and to minimize differential voltages that may develop between the power and ground planes of the PCB as a result of IC switching events by isolating the switching currents as local events. This in turn reduces the potential of the PCB to radiate and conduct electromagnetic interference (EMI).

FIG. 1 shows an equivalent circuit 10 for an integrated circuit 12 and a decoupling capacitor ($C_d$) 14 mounted on a PCB. The intrinsic, or interplanar, capacitance is represented by the capacitor ($C_0$) 16. The power plane is represented by the line 18, and the ground plane by line 20.

The power plane of a PCB should ideally exhibit zero impedance. It is desirable to minimize the impedance of power planes as much as possible. FIG. 2 is a graph showing power plane impedance (Z) versus frequency (MHz) for an example power and ground plane pair within a PCB having a single type of discrete decoupling capacitors mounted thereon. The graph plots the impedance of the power plane, with the PCB configured as a "bare board" (i.e. a PCB without any discrete capacitors mounted thereon), with broken line 22, and the impedance of the power plane, with the PCB having the single type of discrete decoupling capacitors mounted thereon, with solid line 24. As is apparent from the graph, the impedance increases dramatically at operating frequencies above a series resonant frequency ($f_1$) due, inter alia, to the presence of the discrete decoupling capacitors, and the impedance theoretically becomes infinite at a parallel resonant frequency ($f_2$). The impedance of a PCB employing a single type of discrete decoupling capacitors comprises the cumulative impedance of the power and ground planes, vias connecting these planes, traces between capacitors and ICs, and the capacitor mounting pads. The significant increases in the power plane impedance at high frequencies results in the performance of the PCB deteriorating substantially at these frequencies, at which the PCB may not function properly, or may exceed regulatory emission levels.

The series resonant frequency ($f_1$) is determined mainly by the number and location of the single type of discrete decoupling capacitors. By optimizing the number and location of the single type of discrete decoupling capacitors, as well as other PCB characteristics, it is possible to shift the series resonant frequency ($f_1$) to higher frequencies as increased operating frequencies are encountered. However, PCB operating frequencies are being achieved at which it has become increasingly difficult, inefficient, and expensive to match the series resonant frequency ($f_1$) to the PCB operating frequency. Computers are now operating at clock rates much higher than was possible in the past. This results in the creation of high frequency harmonic energy in the hundreds of megahertz, and even into the gigahertz region.

A "Q-factor" may be determined for a resonant structure, such as a structure included within a printed circuit board. The "Q-factor" of a resonant structure is based on the amount of loss in the structure. The higher the amount of loss, the lower the "Q-factor" becomes. In the case of a simple parallel power and ground plane structure there is little loss. Therefore, the "Q-factor" is high. This would normally result in higher EMC emissions.

Therefore a need exists for an improved method and means for decoupling parallel planes included within a printed circuit board both at low-level as well as high-level frequencies.

SUMMARY OF THE INVENTION

An improved method and means for decoupling a printed circuit board are disclosed. A power plane is included having a peripheral edge. The power plane includes a first region and a second region which is separate from and contiguous to the first region. The first region is located from the peripheral edge to a middle portion of the power plane. The first region includes a peripheral portion of the power plane. The second region includes only the middle portion of the power plane. A ground plane is coupled in parallel to the power plane. The ground plane has a peripheral edge. The ground plane includes a first region, and a second region which is separate from and contiguous to the first region. The first region includes the peripheral edge and includes a peripheral portion of the ground plane. The second region includes a middle portion of the ground plane. A first plurality of decoupling elements are connected to the first region of the power plane and to the first region of the ground plane. A second plurality of decoupling elements are connected to the second region of the power plane and to the second region of the ground plane. The first and second plurality of decoupling elements are utilized to decouple the power plane and ground plane pair.

The above as well as additional objectives, features, and advantages of the present invention will become apparent in the following detailed written description.

BRIEF DESCRIPTION OF THE DRAWINGS

The novel features are set forth in the appended claims. The present invention itself, however, as well as a preferred mode of use, further objectives, and advantages thereof, will best be understood by reference to the following detailed description of a preferred embodiment when read in conjunction with the accompanying drawings, wherein:

FIG. 5 illustrates a perspective view of a power plane and a ground plane including removed portions of conductors on these planes in accordance with the method and system of the present invention.

DETAILED DESCRIPTION OF A PREFERRED EMBODIMENT

A preferred embodiment of the present invention and its advantages are better understood by referring to FIGS. 1–5 of the drawings, like numerals being used for like and corresponding parts of the accompanying drawings.

The present invention is an improved printed circuit board for decoupling a pair of planes included within the printed circuit board (PCB). A generally solid power plane and a generally solid ground plane are included in parallel within the PCB. The solid power and ground planes are conductors in themselves and are typically formed from a conducting material such as copper. The power plane includes two regions. The first region is located along the peripheral edge of the power plane and extends from the edge toward a middle of the plane. The second region adjoins the first region and includes only the middle area of the plane.

Similarly, the ground plane includes two regions. The first region is located along the peripheral edge of the ground plane and extends from the edge toward a middle of the plane. The second region adjoins the first region and includes only the middle area of the ground plane.

A first plurality of decoupling elements are connected to the first region of the power plane and the first region of the ground plane to decouple the planes. A second plurality of decoupling elements are connected to the second region of the power plane and the second region of the ground plane to decouple the planes.

The first plurality of decoupling elements includes two types of decoupling capacitors, while the second plurality of decoupling elements includes only one type of decoupling capacitors. In a preferred embodiment, the first plurality of decoupling elements includes both low equivalent series resistance (ESR) capacitors as well as lossy capacitors. The second plurality of decoupling elements includes only lossy capacitors.

In addition, portions of the conductors of either the power plane, the ground plane, or both planes are moved. Therefore, the planes will not conduct in these removed portions. Multiple, rectangular portions of a conductor of a plane are removed. Each portion is parallel to the other portions removed from the plane. Further, the portions removed from one plane are preferably perpendicular to the portions removed from the other plane.

The present invention, therefore, uses a combination of low ESR capacitors and lossy decoupling capacitors coupled to different regions of the parallel planes to significantly reduce or eliminate high frequency resonances without losing the low frequency performance of the ESR decoupling capacitors. This reduction in high frequency resonances results in a significant reduction in EMC emissions and signal integrity, i.e. signal functional, problems due to these resonances.

Figure 1:
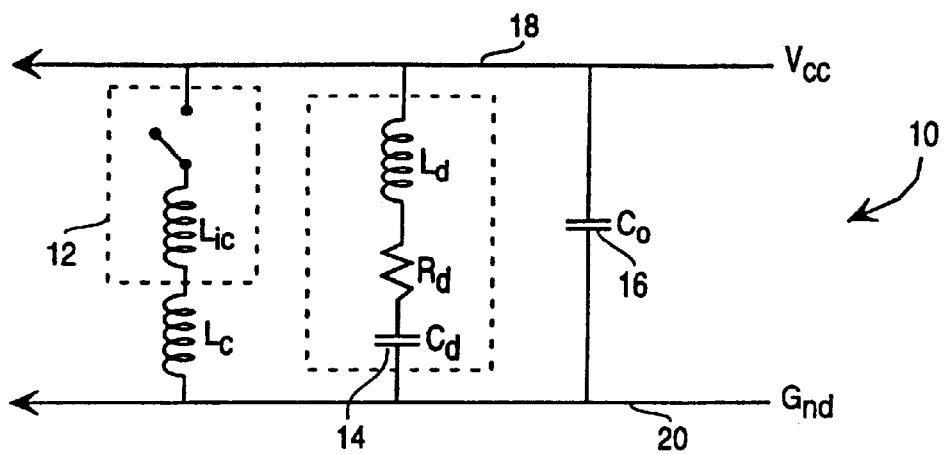
FIG. 1 depicts an equivalent circuit representing an integrated circuit (IC) and a single type of decoupling capacitor mounted on a printed circuit board (PCB) in accordance with the prior art.
Figure 2:
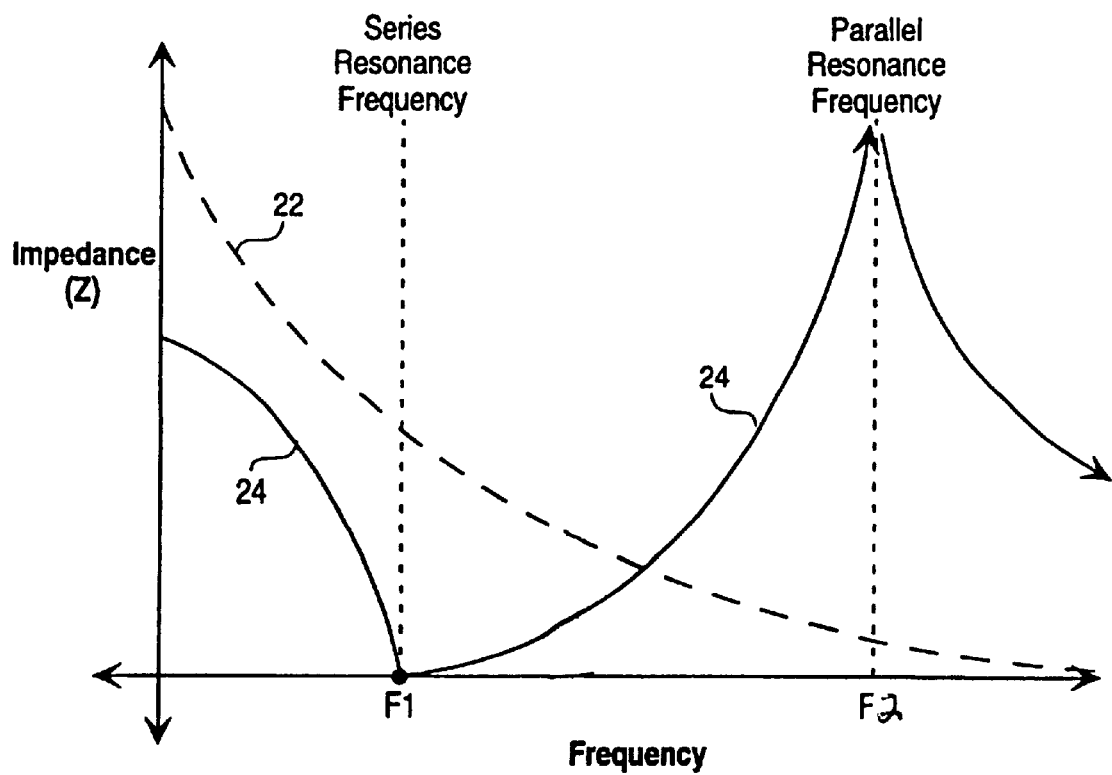
FIG. 2 illustrates a graph plotting impedance of a power plane versus frequency in accordance with the prior art.
Figure 3:
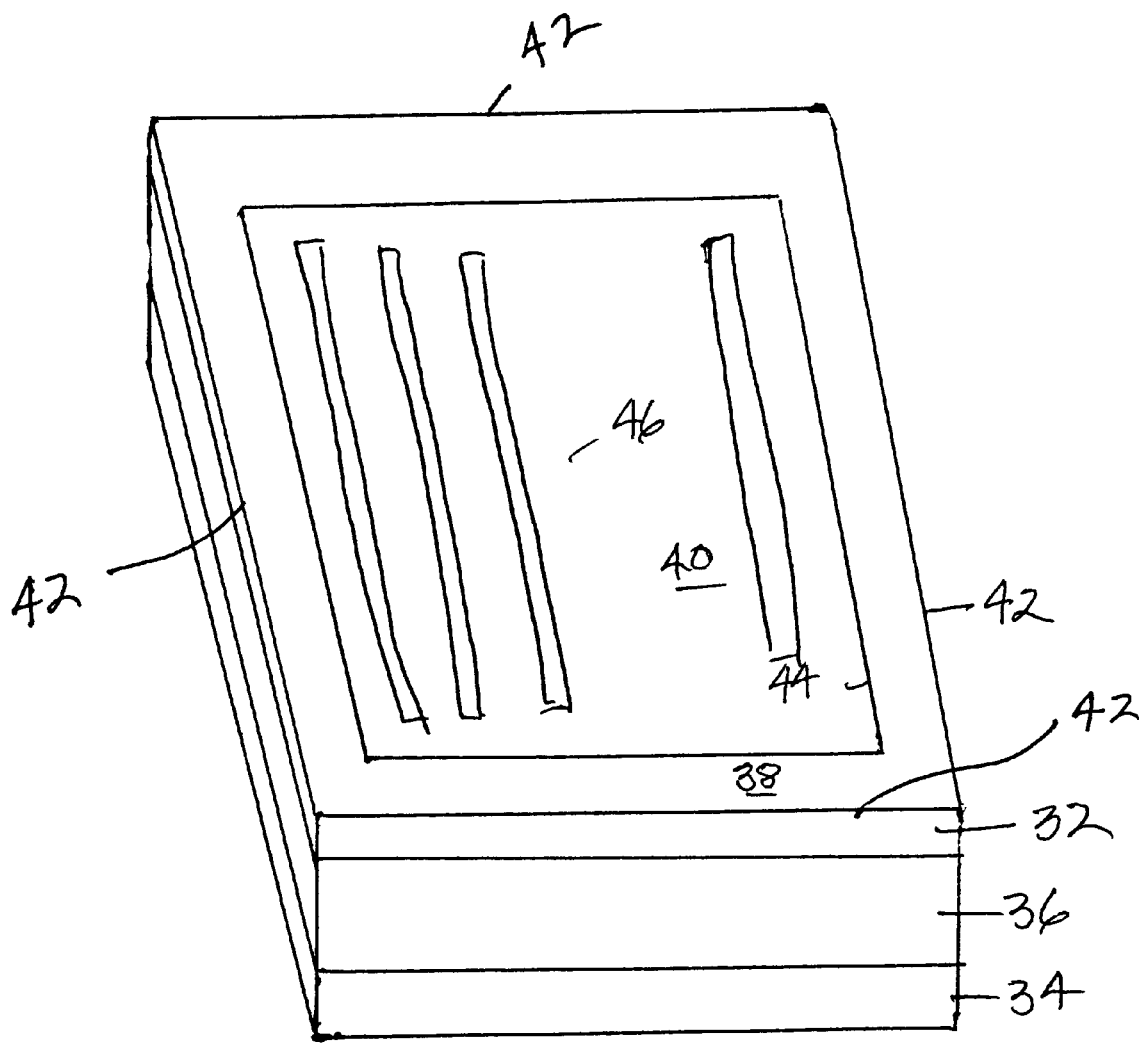
FIG. 3 is a pictorial representation of a power plane and a ground plane separated by a dielectric layer in accordance with the method and system of the present invention.

FIG. 3 is a pictorial representation of a generally solid plane 32 utilized to provide power and a generally solid plane as a ground plane 34 separated by a dielectric layer 36 in accordance with the method and system of the present invention. Power plane 32 and ground plane 34 are located in parallel within a printed circuit board. Dielectric layer 36 separates power plane 32 and ground plane 34 and provides electrical isolation between power plane 32 and ground plane 34. Planes 32, 34 are typically formed from copper. Dielectric layer 36 is typically formed from an insulating material such as epoxy-fiberglass.

Power plane 32, ground plane 34, and dielectric layer 36 are included within a printed circuit board to provide power to the devices within the printed circuit board. A multi-layer PCB typically includes multiple power and ground planes. The present invention will be described with reference to a single power plane and ground plane pair. However, those skilled in the art will recognize that the present invention may also be utilized in PCBs having multiple power/ground plane pairs.

Power plane 32 and ground plane 34 are each divided into multiple regions. In the preferred embodiment, each plane is divided into two separate and distinct regions. A first region includes an area from the peripheral edge of the plane in toward the center of the plane. In the preferred embodiment, the first region is a rectangular region extending inward from the peripheral edge of the plane. The second region includes the remainder of the plane which includes a middle area of the plane.

Power plane 32 includes a first region 38 and a second region 40. First region 38 extends from a peripheral edge 42 of power plane 32 toward a line 44 which divides first region 38 from second region 40. Second region 40 extends from line 44 toward a middle 46 of plane 32.

Figure 4:
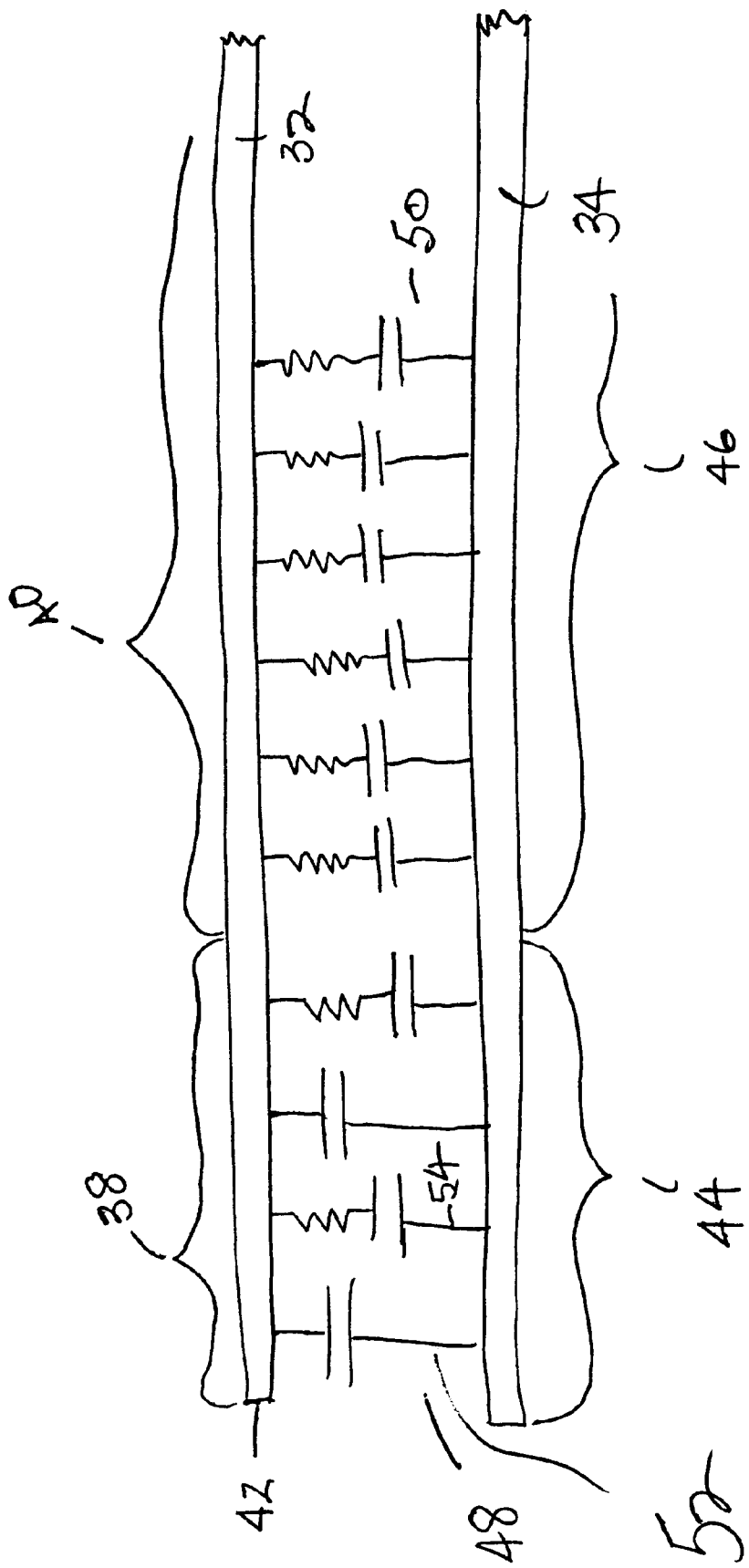
FIG. 4 is a schematic diagram of a power plane, a ground plane, a first plurality of decoupling elements connected to a first region of the planes, and a second plurality of decoupling elements connected to a second region of the planes in accordance with the method and system of the present invention.

FIG. 4 is a schematic diagram of a power plane, a ground plane, and first and second plurality of decoupling elements in accordance with the method and system of the present invention. Power plane 32 includes a first region 38 and a second region 40. Similarly, ground plane 34 includes a first region 44 and a second region 46. First regions 38 and 44 and second regions 40 and 46 are similarly shaped and located on their respective planes.

A first plurality of decoupling elements 48 are connected to first regions 38 and 44. A second plurality of decoupling elements 50 are connected to second regions 40 and 46. In this manner, first decoupling elements 48 are connected to power plane 32 and ground plane 34 along a peripheral area of planes 32 and 34. Preferably, first decoupling elements 48 are coupled to planes 32 and 34 in a generally rectangularly-shaped frame. Second decoupling elements 50 are connected to power plane 32 and ground plane 34 in a solid, middle, rectangular area of planes 32 and 34.

First decoupling elements 48 include two types of decoupling elements, low equivalent series resistance (ESR) capacitors and lossy capacitors. The ESR capacitors, such as capacitor 52, provide good decoupling performance at low frequencies, typically below 400 MHz. The lossy capacitors, such as the series resistance and capacitor element 54, significantly lower the "Q" factor of the resonant structure. In a preferred embodiment, approximately 40–60% of the total decoupling elements 48 should be lossy capacitors. The remaining decoupling elements 48 should be ESR capacitors.

Second decoupling elements 50 include only one type of decoupling element, i.e. lossy capacitors. Lossy capacitors, such as element 54, are utilized for all of decoupling elements 50.

FIG. 5 illustrates a perspective view of power plane 32 and ground plane 34 including removed portions of conductors on these planes in accordance with the method and system of the present invention. To further alter the resonant structure of the power/ground plane pair, portions of the conductors are removed from each plane. A plurality of portions 60 of the conductor of power plane 32 are removed, and a plurality of portions 62 of the conductor of ground plane 34 are removed. The plane will not conduct in these removed portions.

In accordance with an important feature of the present invention, the portions are removed from only the second regions of each board. Therefore, portions 60 are removed from region 40, and portions 62 are removed from region 46. In this manner, portions 60, 62 do not extend to an edge of either plane.

Preferably, each portion is a generally rectangularly-shaped portion positioned parallel to each other removed portion on the plane. Therefore, within a single plane, the conductor is removed in parallel, rectangular portions from the plane.

In accordance with another important feature of the present invention, the portions removed from one plane are perpendicular to the portions removed from the other plane. Therefore, portions 60 are perpendicular to portions 62.

The resonance is due in part to the size of the planes. By removing portions of the conductor of a plane, the resonance frequency of the plane is adjusted to a higher frequence, well beyond the frequencies of concern. The current must flow in a particular manner in order for the standing wave to form. By removing portions of the conductor, the standing wave cannot form. None of the conductor near the edge of the plane is removed, however. Therefore, the DC voltage remains constant on the planes.

The present invention uses a combination of three different approaches to reduce or eliminate high frequency resonances. The low ESR capacitors provide good decoupling performance at lower frequencies below 400 MHz. The lossy capacitors, including a capacitor and resistor in series, significantly lower the "Q factor" of the resonant structure, thereby greatly reducing the peak energy contained within the resonances. Removing portions of the conductors in one or more of the planes changes the size of the resonant structure, effectively moving the resonant frequencies to frequencies which are much higher, typically 10–100 GHz. Therefore, the potential resonances in the frequencies from 400 to 1–5 GHz are either eliminated or greatly reduced.

While a preferred embodiment has been particularly shown and described, it will be understood by those skilled in the art that various changes in form and detail may be made therein without departing from the spirit and scope of the present invention.

What is claimed is:

1. A printed circuit board, comprising:
   a power plane including a first region and a second region;
   a ground plane located parallel to said power plane, said ground plane including a first region and a second region;
   a first plurality of decoupling elements connected to said first region of said power plane and said first region of said ground plane; and
   a second plurality of decoupling elements connected to said second region of said power plane and said second region of said ground plane.

2. The printed circuit board according to claim 1, further comprising said second region of said power plane being separate from and contiguous to said first region of said power plane.

3. The printed circuit board according to claim 2, further comprising said power plane having a peripheral edge, wherein said first region is located from said peripheral edge to a middle portion of said power plane, said first region including a peripheral portion of said power plane, and said second region including said middle portion of said power plane.

4. The printed circuit board according to claim 3, further comprising said ground plane having a peripheral edge, said ground plane including a first region and a second region which is separate from and contiguous to said first region, said first region including said peripheral edge and including a peripheral portion of said ground plane, said second region including a middle portion of said ground plane.

5. The printed circuit board according to claim 4, wherein said first plurality of decoupling elements further comprises a first plurality of a first type of decoupling capacitors.

6. The printed circuit board according to claim 5, wherein said first type of decoupling capacitors further comprises a plurality of low equivalent series resistance capacitors.

7. The printed circuit board according to claim 6, wherein said second plurality of decoupling elements further comprises a second plurality of said first type of decoupling capacitors and a plurality of a second type of decoupling capacitors.

8. The printed circuit board according to claim 7, wherein said second type of decoupling capacitors further comprises a plurality of lossy capacitors.

9. The printed circuit board according to claim 8, wherein each of said plurality of lossy capacitors includes a resistor and capacitor coupled together in series.

10. The printed circuit board according to claim 9, wherein a first half of said second plurality of decoupling elements further includes low equivalent series resistance capacitors and a second half of said second plurality of decoupling elements further includes a plurality of lossy capacitors.

11. The printed circuit board according to claim 1, wherein said first plurality of decoupling elements further comprises a first plurality of a first type of decoupling capacitors.

12. The printed circuit board according to claim 11, wherein said first type of decoupling capacitors includes low equivalent series resistance capacitors.

13. The printed circuit board according to claim 12, wherein said second plurality of decoupling elements further comprises a second plurality of said first type of decoupling capacitors and a plurality of a second type of decoupling capacitors.

14. The printed circuit board according to claim 13, wherein said second type of decoupling capacitors further comprises lossy capacitors.

15. The printed circuit board according to claim 14, wherein each of said lossy capacitors includes a resistor and capacitor coupled together in series.

16. The printed circuit board according to claim 15, wherein a first half of said second plurality of decoupling elements further includes equivalent series resistance capacitors and a second half of said second plurality of decoupling elements further includes lossy capacitors.

17. The printed circuit board of claim 1, further comprising said power plane having a plurality of portions removed from a conductor of said power plane.

18. The printed circuit board of claim 17, further comprising each one of said plurality of portions of said conductor removed from said power plane being generally rectangularly shaped.

19. The printed circuit board of claim 17, further comprising each one of said plurality of portions of said conductor removed from said power plane being generally parallel to all others of said plurality of portions of said conductor removed from said power plane.

20. The printed circuit board of claim 19, further comprising said ground plane having a plurality of portions removed from a conductor of said ground plane.

21. The printed circuit board of claim 20, further comprising each one of said plurality of portions of said conductor removed from said power plane being generally rectangularly shaped.

22. The printed circuit board of claim 21, further comprising each one of said plurality of portions of said conductor removed from said ground plane being generally rectangularly shaped.

23. The printed circuit board of claim 22, further comprising each one of said plurality of portions of said conductor removed from said ground plane being generally parallel to all others of said plurality of portions of said conductor removed from said ground plane.

24. The printed circuit board of claim 23, further comprising each one of said plurality of portions of said conductor removed from said power plane being generally perpendicular to each one of said plurality of portions of said conductor removed from said ground plane.

25. A method for decoupling a pair of planes included within a printed circuit board, said method comprising the steps of:
   establishing a power plane including a first region and a second region;
   establishing a ground plane located parallel to said power plane, said ground plane including a first region and a second region;
   establishing a first plurality of decoupling elements connected to said first region of said power plane and said first region of said ground plane; and
   establishing a second plurality of decoupling elements connected to said second region of said power plane and said second region of said ground plane.

26. The method according to claim 25, further comprising establishing said second region being separate from and contiguous to said first region.

27. The method according to claim 26, further comprising establishing said power plane having a peripheral edge, wherein said first region is located from said peripheral edge to a middle portion of said power plane, said first region including a peripheral portion of said power plane, and said second region including said middle portion of said power plane.

28. The method according to claim 27, further comprising establishing said ground plane having a peripheral edge, said ground plane including a first region and a second region which is separate from and contiguous to said first region, said first region including said peripheral edge and including a peripheral portion of said ground plane, said second region including a middle portion of said ground plane.

29. The method according to claim 28, wherein said step of establishing said first plurality of decoupling elements further comprises the step of establishing a first plurality of a first type of decoupling capacitors.

30. The method according to claim 29, wherein said step of establishing said first type of decoupling capacitors further comprises the step of establishing said first type of decoupling capacitors including low equivalent series resistance capacitors.

31. The method according to claim 30, wherein said step of establishing said second plurality of decoupling elements further comprises the step of establishing a second plurality of said first type of decoupling capacitors and a plurality of a second type of decoupling capacitors.

32. The method according to claim 31, wherein said step of establishing said second type of decoupling capacitors further comprises the step of establishing said second type of decoupling capacitors including lossy capacitors.

33. The method according to claim 32, further comprising the step of establishing said second type of decoupling capacitors including lossy capacitors, each of said lossy capacitors including a resistor and capacitor coupled together in series.

34. The method according to claim 33, further comprising the step of establishing said power plane having a plurality of portions of removed from a conductor of said power plane.

35. The method according to claim 34, further comprising the step of establishing each one of said plurality of portions of said conductor removed from said power plane being generally rectangularly shaped.

36. The method according to claim 35, further comprising the step of establishing each one of said plurality of portions of said conductor removed from said power plane being generally parallel to all others of said plurality of portions of said conductor removed from said power plane.

37. The method according to claim 36, further comprising the step of establishing said ground plane having a plurality of portions of a conductor removed from said ground plane.

38. The method according to claim 37, further comprising the step of establishing each one of said plurality of portions of said conductor removed from said power plane being generally rectangularly shaped.

39. The method according to claim 38, further comprising the step of establishing each one of said plurality of portions of said conductor removed from said ground plane being generally rectangularly shaped.

40. The method according to claim 39, further comprising the step of establishing each one of said plurality of portions of said conductor removed from said ground plane being generally parallel to all others of said plurality of portions of said conductor removed from said ground plane.

41. The method according to claim 40, further comprising the step of establishing each one of said plurality of portions of said conductor removed from said power plane being generally perpendicular to each one of said plurality of portions of said conductor removed from said ground plane.

42. A printed circuit board, comprising:
   a power plane having a peripheral edge and including a first region and a second region, said second region being separate from and contiguous to said first region of said power plane, said first region being located from said peripheral edge to a middle portion of said power plane, said first region including a peripheral portion of said power plane, and said second region including said middle portion of said power plane;
   a ground plane located parallel to said power plane, said ground plane having a peripheral edge and including a first region and a second region separate from and contiguous to said first region, said first region including said peripheral edge and including a peripheral portion of said ground plane, said second region including a middle portion of said ground plane;
   a first plurality of decoupling elements connected to said first region of said power plane and said first region of said ground plane, a first half of said first plurality of decoupling elements including a plurality of lossy capacitors and a second half of said first plurality of decoupling elements including a plurality of low equivalent series resistance capacitors;

a second plurality of decoupling elements connected to said second region of said power plane and said second region of said ground plane, said second plurality of decoupling elements further comprising a plurality of lossy capacitors;

each of said plurality of lossy capacitors of said first and second plurality of decoupling elements including a resistor and capacitor coupled together in series;

said power plane having a plurality of generally rectangularly shaped portions removed from a conductor of said power plane, each one of said plurality of portions of said conductor removed from said power plane being generally parallel to all others of said plurality of portions of said conductor removed from said power plane;

said ground plane having a plurality of generally rectangular shaped portions removed from a conductor of said ground plane, each one of said plurality of portions of said conductor removed from said ground plane being generally rectangularly shaped;

each one of said plurality of portions of said conductor removed from said ground plane being generally parallel to all others of said plurality of portions of said conductor removed from said ground plane; and each one of said plurality of portions of said conductor removed from said power plane being generally perpendicular to each one of said plurality of portions of said conductor removed from said ground plane.

* * * * *